United States Patent [19]
Fusselman et al.

[11] Patent Number: 6,102,716
[45] Date of Patent: *Aug. 15, 2000

[54] PC CARD CONNECTOR HAVING IMPROVED RESILIENT EJECT MECHANISM AND METHOD OF USE

[75] Inventors: David L. Fusselman, Middletown; John M. Spickler, Marietta, both of Pa.

[73] Assignee: Berg Technology, Inc., Reno, Nev.

[*] Notice: This patent is subject to a terminal disclaimer.

[21] Appl. No.: 08/596,750

[22] Filed: Feb. 5, 1996

Related U.S. Application Data

[63] Continuation of application No. 08/332,928, Oct. 31, 1994, Pat. No. 5,492,480.

[51] Int. Cl.⁷ .................................................. H01R 13/62
[52] U.S. Cl. .......................................... 439/157; 439/155
[58] Field of Search ................................. 439/152–160, 439/372

[56] References Cited

U.S. PATENT DOCUMENTS

| | | | |
|---|---|---|---|
| 3,374,457 | 3/1968 | Herrick | 439/155 |
| 4,426,122 | 1/1984 | Lainez et al. | 439/157 |
| 4,734,049 | 3/1988 | George et al. | 439/157 |
| 4,838,804 | 6/1989 | Banjo | 439/325 |
| 4,952,161 | 8/1990 | Kormatsu | 439/155 |
| 5,151,847 | 9/1992 | Rautenberg | 439/155 |
| 5,414,594 | 5/1995 | Kristake | 439/155 |

*Primary Examiner*—Paula Bradley
*Assistant Examiner*—Tho D. Ta
*Attorney, Agent, or Firm*—Brian J. Hamilla; M. Richard Page

[57] ABSTRACT

A connector assembly for a PC card, including a spring positioned in recesses in the lateral longitudinal elements of the frame. After the PC card unmates with the connector portion of the assembly, the spring imparts additional forward longitudinal force to the PC card while passing the recesses. This allows the PC card to be ejected an additional distance from the connector, where it can be easily gripped and withdrawn by the user. A method of ejecting a PC card from a computer in which the PC card is first moved out of engagement with the connector to an initial location. Then, the PC card is moved by an automatically activated resilient device to a location further away from the connector.

14 Claims, 7 Drawing Sheets

PC CARD CONNECTOR HAVING IMPROVED RESILIENT EJECT MECHANISM AND METHOD OF USE

This application is a continuation of application Ser. No. 08/332,928, filed Oct. 31, 1994, U.S. Pat. No. 5,492,480.

BACKGROUND OF THE INVENTION

1. Field of the Invention

The present invention relates to electrical connectors and more particularly to electrical connectors for computer memory cards.

2. Brief Description of Prior Developments

Memory cards are conventionally connected to computers by means of connectors comprising a frame member which will have a transverse rear element and a pair of longitudinal elements having opposed card receiving grooves on their inner surfaces. A connector header is positioned adjacent the transverse rear element, and the memory card is inserted between the side elements of the frame and then engaged with the header. The connector also includes an eject mechanism which conventionally may be an eject plate which is positioned directly beneath the rear transverse element of the frame. An ejector actuator bar is positioned adjacent to one of the longitudinal elements of the frame and extends rearwardly to be connected by a pin to one end of an eject arm. The eject arm is at its other end connected to the eject plate and is medially connected by a fulcrum pin to both the eject plate and the rear transverse section of the frame. When the user applies inward longitudinal pressure to the actuator bar, the arm pivots on the fulcrum pin to move the ejector plate forward against the rear end of the memory card so as to move it out of engagement with the connector header. A disadvantage to such memory card ejection systems exists in that the memory card may be moved forward by an amount of approximately 4 mm which may be inadequate to allow the user to conveniently grip the front end of the memory card for further manual withdrawal.

A need, therefore, exists for a memory card connector having an eject mechanism which will allow the card to be moved forward by a degree which will allow the front end of the card to be easily gripped for further manual removal.

It has been suggested to place a longitudinally oriented spring at the rear of the frame which will exert additional force on the memory card when it is disengaged. Such systems may, however, have disadvantages in that they may tend to disengage the memory card from the connector at unintended times.

Further need, therefore, exists for means for augmenting the longitudinal force on the memory card during ejection which exerts substantially no such longitudinal force at other times.

SUMMARY OF THE INVENTION

The memory card connector of the present invention comprises a frame member having a rear transverse element and opposed longitudinal elements and a connector header positioned adjacent the rear transverse element. As with conventional eject mechanisms, there is an actuator bar which is connected to an eject arm that pivots on a fulcrum pin to move an eject plate against the rear edge of the memory card. Additionally, on the inner side of the longitudinal elements of the frame there are recesses that house a resilient spring means or other stored energy means which are activated as the memory card is pushed beyond these recesses. Upon activation, these spring means exert further force on the card in a longitudinal direction to supplement the force exerted by the actuator bar and eject plate mechanism. This resilient spring means may be a torsion spring which has one leg fixed to the side element of the frame which has a second leg which is compressed in a recess on the inner side of the side element by the engaged memory card. When the rear end of the memory card is pushed forward beyond the rear terminal end of the second spring leg, that spring leg will begin to expand and exert longitudinally directed force on the memory card. In another embodiment the recess has a wide rear portion and a narrow forward portion between which there is a sloping cam surface. An eject finger which is fitted into a longitudinally oriented helical spring is positioned in this recess. This eject finger has a cylindrical head with a forward sloping surface. When the memory card is engaged with the connection header the eject finger is positioned in the wider section of the recess. As the end of the memory card passes the memory finger, the longitudinal spring expands so that the slopped surface on the cylindrical head of the eject finger bears against the rear corner of the memory card and imparts a further longitudinal force to the memory card. No force or substantially no force is exerted on the memory card in a longitudinal direction until the memory card has first been disengaged from the connector. The term "memory card" as used herein includes any type 1, type 2 or type 3 PCMCIA card as well as any other card which may be used in any type of computer system to perform a similar function.

The invention also includes a method for ejecting a memory card from a computer in which the memory card is first moved forward and out of engagement with the connector to an initial distance after which it is moved still further forward by an automatically activated resilient device.

BRIEF DESCRIPTION OF THE DRAWINGS

The invention is further described with reference to the accompanying drawings in which.

DETAILED DESCRIPTION OF THE PREFERRED EMBODIMENTS

Figure 1:
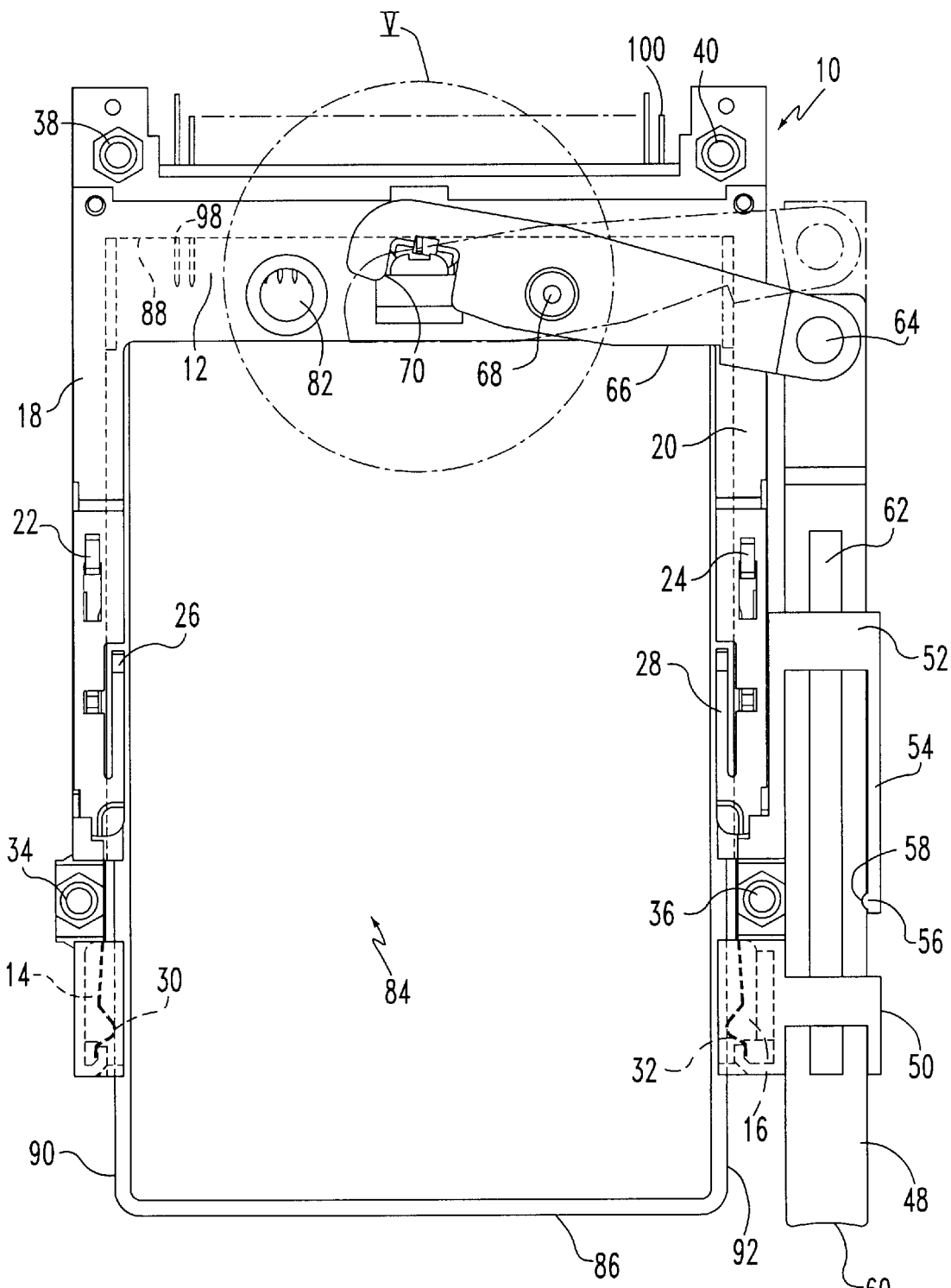
FIG. 1 is a top plan view of the memory card and connector assembly of the present invention.
Figures 2, 3, 5:
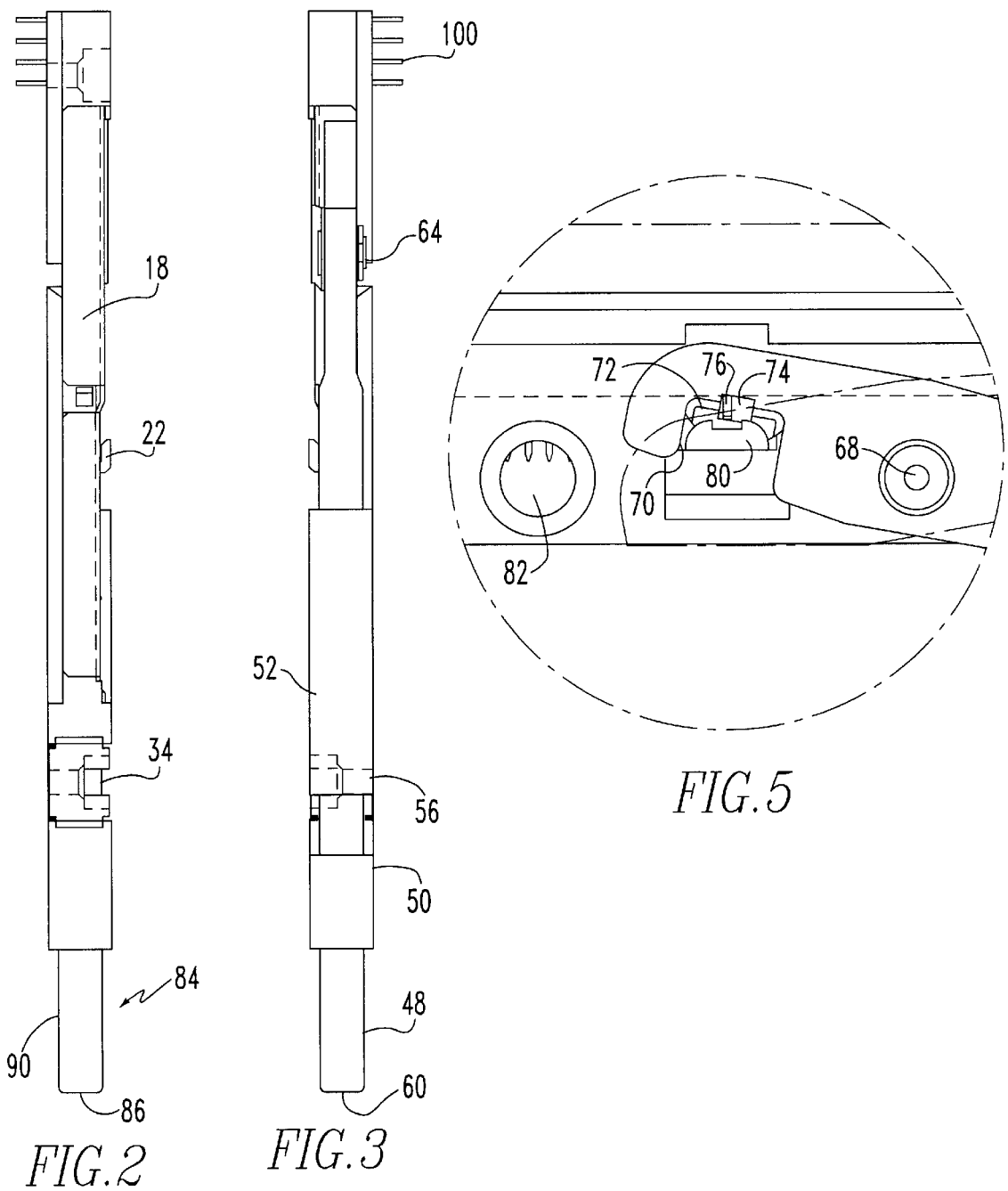
FIG. 2 is an end view of the memory card and connector assembly shown in FIG. 1.
FIG. 3 is a side view of the memory card and connector assembly shown in FIG. 1.
FIG. 5 is a detailed view of the area in circle V in FIG. 1.
Figure 4:
FIG. 4 is the opposite side view from the view shown in FIG. 3.
Figure 6:
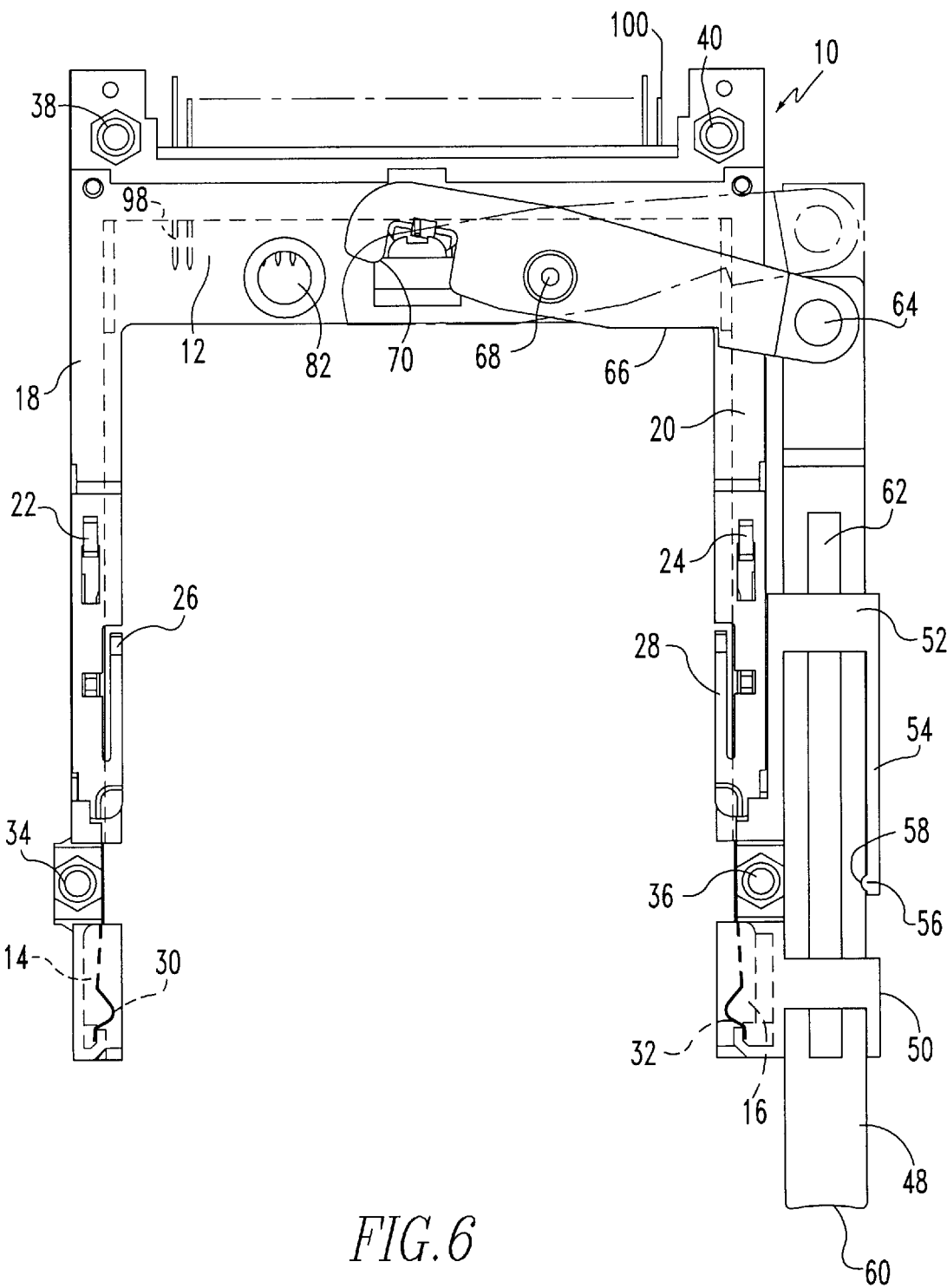
FIG. 6 is a top plan view similar to FIG. 1 except that the memory card has been removed to show only the connector.
Figure 8:
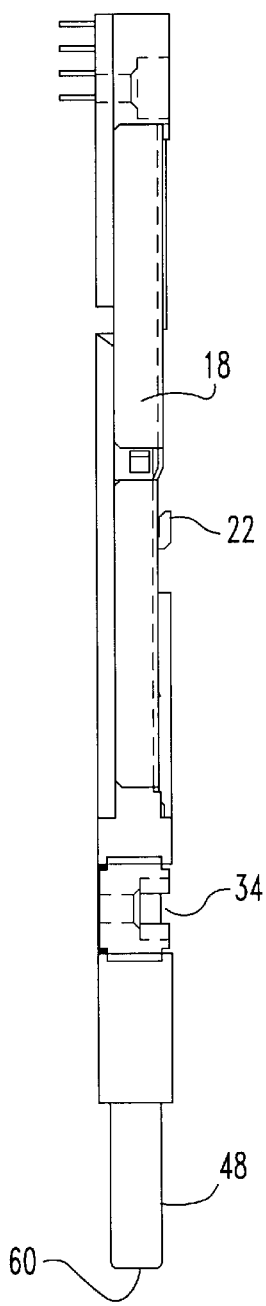
FIG. 8 is a side view of the connector shown in FIG. 6.
Figure 9:
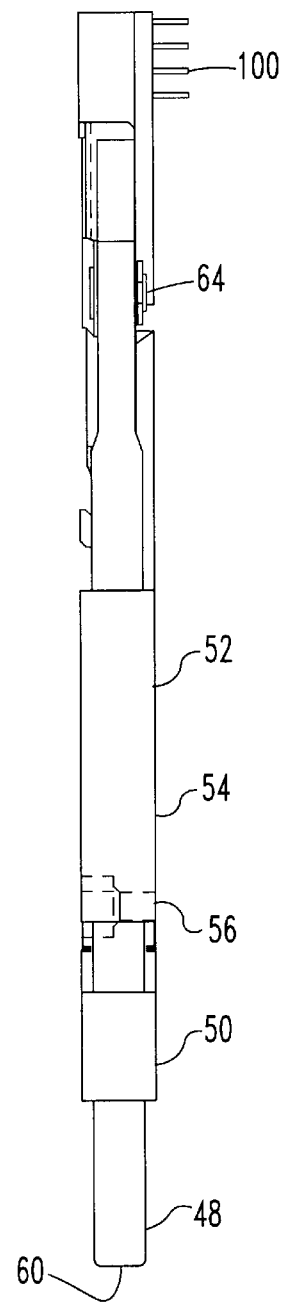
FIG. 9 is an opposite side view from the view shown in FIG. 8.
Figure 7:
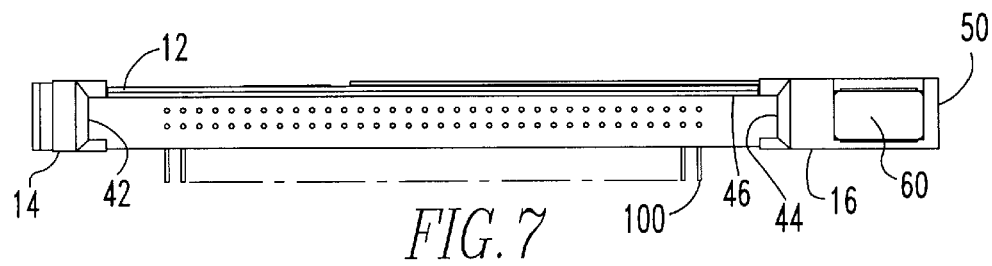
FIG. 7 is a front end view of the connector shown in FIG. 6.
Figure 10:
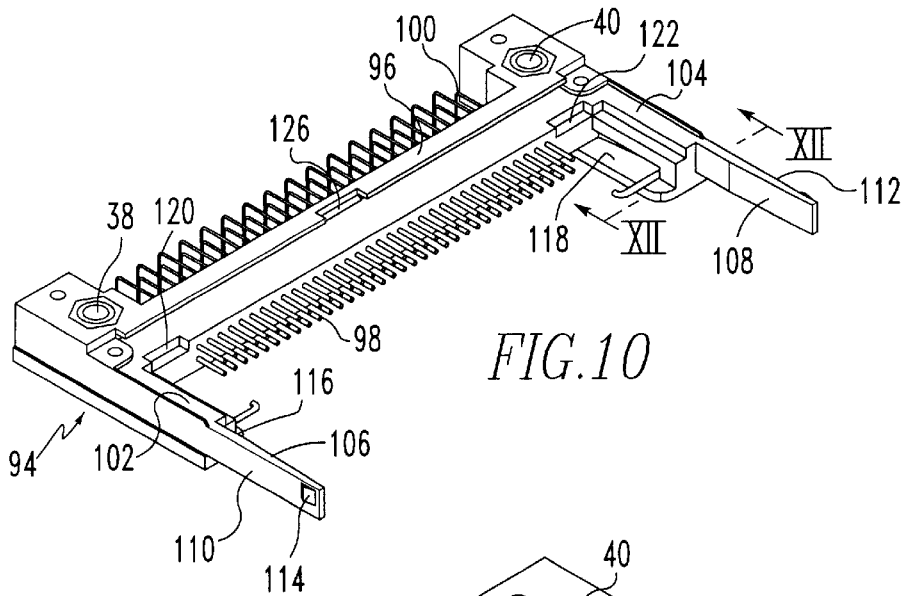
FIG. 10 is a perspective view of the connector header of the memory card and the connector assembly shown in FIG. 1.
Figure 11:
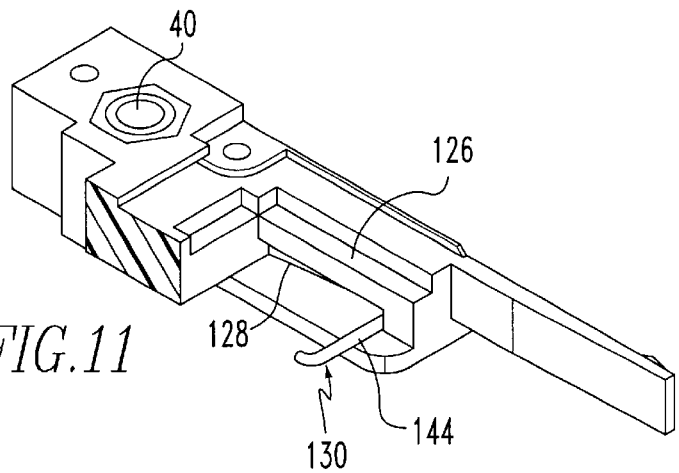
FIG. 11 is a detailed view of the area within circle XI in FIG. 10.
Figures 12, 13:
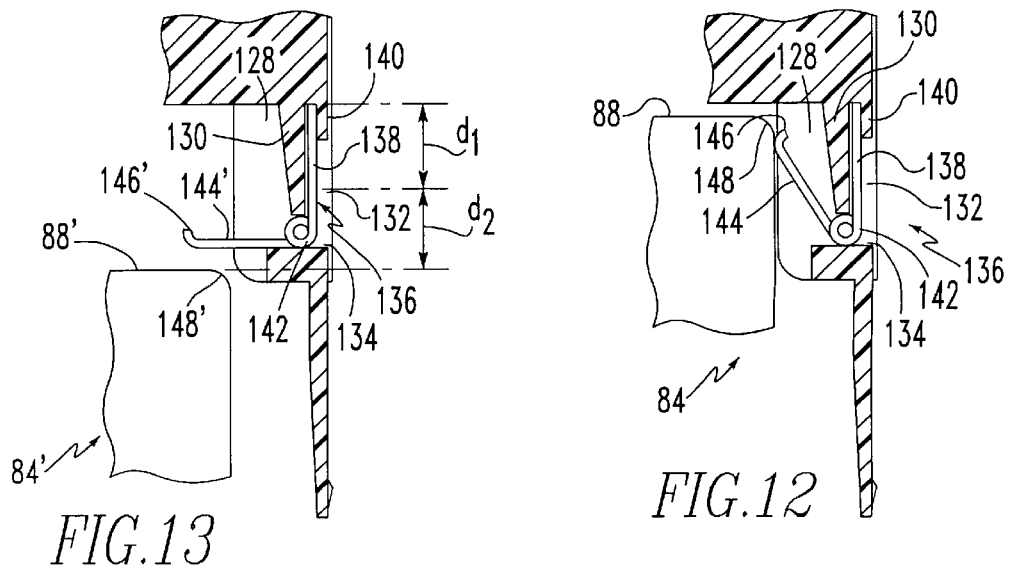
FIGS. 12 and 13 are detailed cross sectional views at an area as at line XII—XII in FIG. 11 showing two successive positions of the spring element in relation to the memory card.
Figure 14:
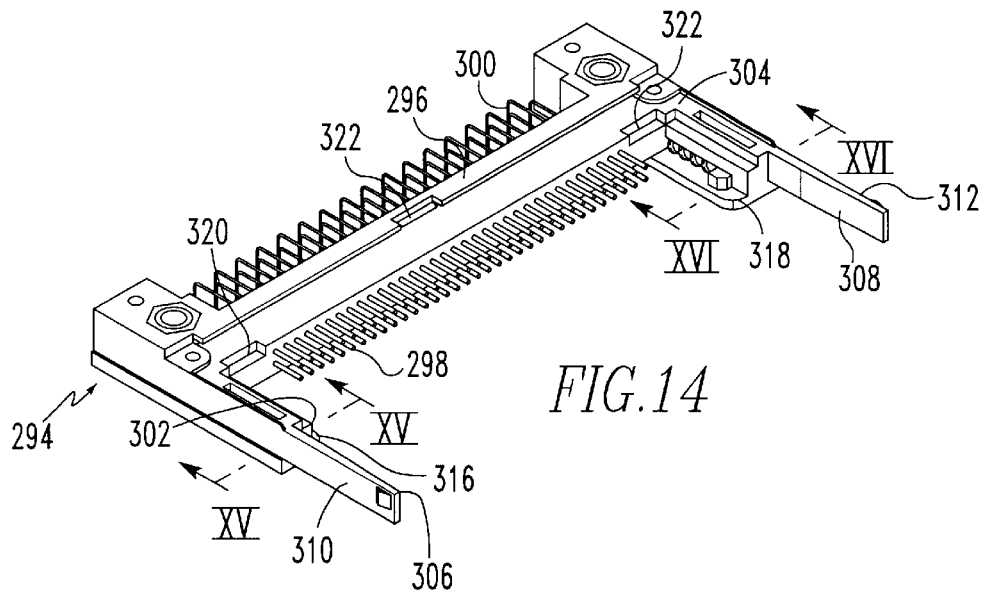
FIG. 14 is a perspective view of a connector header similar to that shown in FIG. 12 in which another preferred embodiment of the present invention is illustrated.
Figure 15:
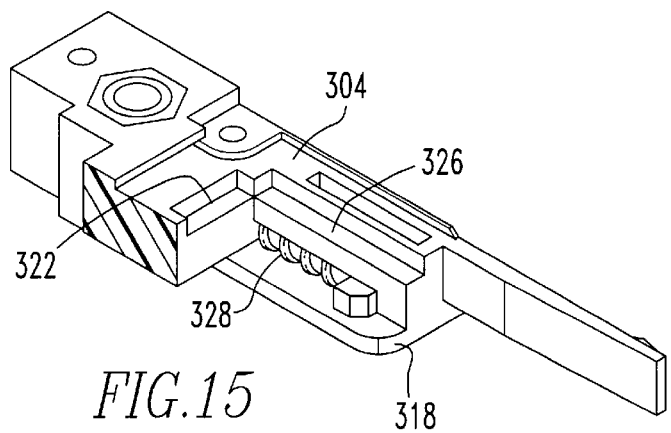
FIG. 15 is a detailed view of the area within circle XV in FIG. 14.
Figure 16:
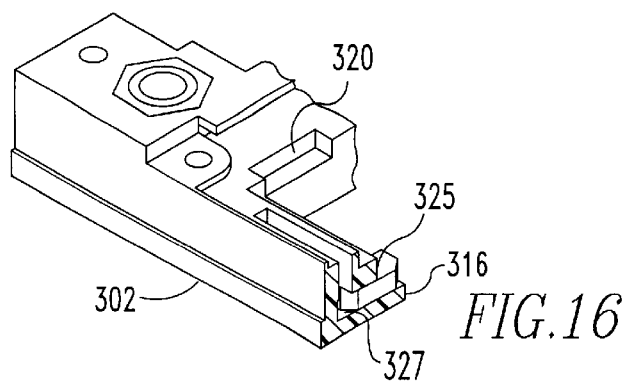
FIG. 16 is a detailed view of the area within circle XVI in FIG. 14.

Referring to FIGS. 1 through 4, the memory card and connector assembly of the present invention includes a frame member shown generally at numeral 10. This frame member is made up of a metallic rear transverse element 12 and two plastic longitudinal elements 14 and 16. The rear transverse element has metal extensions 18 and 20 which extend perpendicularly therefrom to be connected to the longitudinal elements by means of clips respectively at 22 and 24. On the longitudinal elements 14 and 16 there are also ESD contacts respectively at 26 and 28 and EMI contacts respectively at 30 and 32. There are also front apertures respectively at 34 and 36 through these two longitudinal elements which with rear apertures 38 and 40 in the header as is explained below will be used to connect the assembly to a printed wiring board. Referring particularly to FIGS. 4 and 7, there are side grooves 42 and 44 in the two longitudinal elements which serve to retain the memory card between those elements. Still referring to FIG. 7, it will be seen that there is also a card engagement plate 46 immediately beneath the rear transverse element of the frame. Referring again generally to FIGS. 1 through 11 there is an activator bar 48 immediately adjacent to longitudinal element 16 which is fixed to that element by means of guide retainers 50 and 52 which allow longitudinal sliding motion of the activator bar. Guide retainer 52 has a forward extending arm 54 with a terminal projection 56 that engages a vertical groove 58 in the activator bar to be fixed in its forward position. Other such vertical grooves (not shown) may be used to allow the activator bar to be fixed in rearward positions. The activator bar also includes a curved front pressure surface 60 where the user can apply from a finger, pressure from a finger and a longitudinal groove 62. At its inward terminal end the activator bar is connected by means of pin 64 to arm 66. This arm is connected by means of fulcrum pin 68 to the rear transverse element of the frame member and the card engagement plate positioned immediately beneath that rear transverse element. Referring particularly to FIG. 5, it will be seen that its opposite end the arm has a recess 70 from which cam projection 72 extends. There is a central aperture 74 in the rear transverse element and a projection 76 extends from the card engagement plate to engage the arm at a point immediately behind the cam projection. Extending upwardly then rearwardly from the card engagement plate there is a cam retaining element which overlaps the cam and allows movement therein. There is also an aperture 82 in the rear transverse element which aligns with another aperture in the card engagement plate when the activator bar is depressed to its reverse position. It will be appreciated that when pressure is applied rearwardly to the front pressure surface of the activator bar the arm will pivot on the fulcrum pin and move the card engagement plate forward to displace the card from the connector header. Referring again to FIGS. 1 through 11 generally, the memory card shown generally at 84 has a front end 86, a rear end 88 and opposed sides 90 and 92. The connector header is shown generally at numeral 94 and includes a transverse bar 96, front pins as at 98, rear pins as at 100 and opposed side legs 102 and 104. These side legs have respectively inside surfaces 106 and 108, outside surfaces 110 and 112 and on these outside surfaces there are terminal clips as at 114 by means of which it engages the longitudinal elements of the frame. Adjacent the transverse bar there are also floor projections respectively at 116 and 118 on the transverse bar there are also lateral recesses 120 and 122 and a medial recess 124 which serve to accommodate downwardly extending projections from the card engagement plate. On the inner sides of both of the longitudinal elements of the frame member adjacent the transverse element there are longitudinal ledges as at 126 which form inner side longitudinal recesses as at 128. Referring particularly to FIGS. 12 and 13, it will be seen that there is also a vertical wall 130 adjacent each of these inner longitudinal recesses which form an outer longitudinal recess as at 132 and a transverse recess as at 134. These recesses house a torsion spring shown generally at numeral 136 which has a first leg 138 which is fixed in the outer longitudinal recess by a retaining projection 140. A loop 142 is retained in the transverse recess and a second leg 144 is retained in the inner longitudinal recess when the card is engaged with a connection header. As the card is disengaged from the connection header as described above by the card engagement plate to an initial distance $d_1$ the second leg of the spring is allowed to expand so that the curved terminal end 146 of the second leg moves outwardly against the rounded corner 148 of the card so as to impart increasing amounts of force in a longitudinal direction to the card. As the card passes this inner longitudinal recess the spring will eventually become fully expanded to a position as is shown in FIG. 13 where the second leg is essentially perpendicular to the first leg. This expansion of the spring will move the memory card a further longitudinal distance $d_2$ forward. Preferably the distance $d_1$ will be from 1 mm to 3 mm, and the distance $d_2$ will be from 3 mm to 5 mm. No force or substantially no force will be exerted on the memory card in a longitudinal direction until the card has already been disengaged from the connector.

Figure 17:
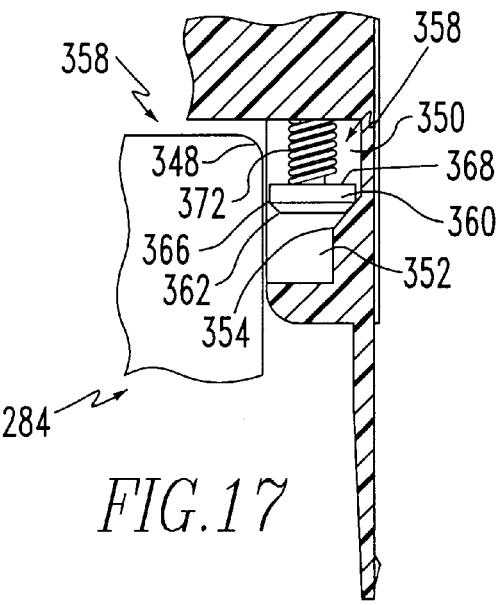
FIGS. 17 and 18 are horizontal cross sectional views as through line XVII—XVII in FIG. 16 showing two successive positions of the spring relative to the memory card.
Figure 18:
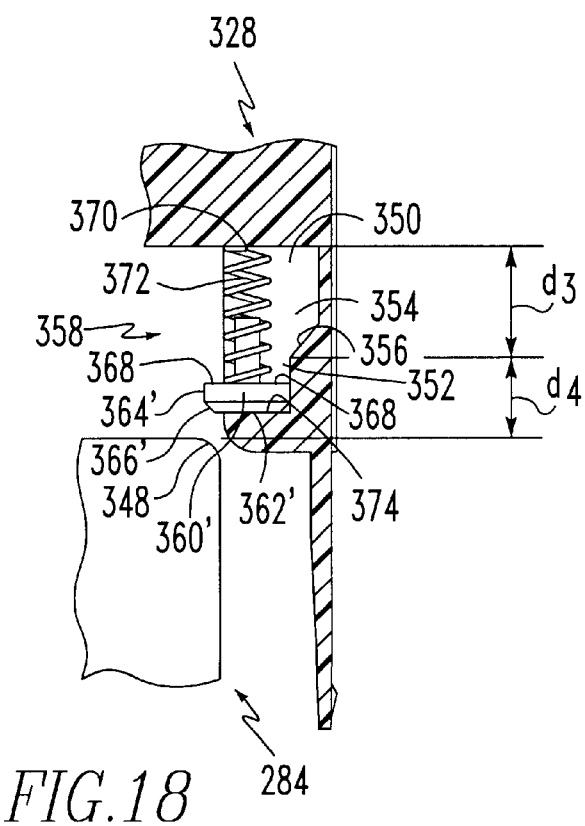

An alternate preferred embodiment is shown in FIGS. 14 through 18 in which the connector header is shown generally at numeral 294 includes a transverse bar 296, front pins as at 298, rear pins as at 300 and opposed side legs 302 and 304. These side legs have respectively inside surfaces 306 and 308, outside surfaces 310 and 312 and on these outside surfaces there are terminal clips as at 314 by means of which it engages the longitudinal elements of the frame. Adjacent the transverse bar there are also floor projections respectively at 316 and 318 on the transverse bar there are also lateral recesses 320 and 322 and a medial recess 324 which serve to accommodate downwardly extending projections from the card engagement plate. On the inner sides of both of the longitudinal elements of the frame member adjacent the transverse element there are longitudinal ledges 325 and 326 which form inner side longitudinal recesses 327 and 328. Referring particularly to FIGS. 17 and 18, it will be seen that this eject finger is comprised of a cylindrical head section 360 which has a planar front surface 362, a curved peripheral surface 364 and a cam surface 366. It also has a rear planar surface 368 from where a rearward projection 370 extends to engage a longitudinal helical spring 372. In this embodiment as the card is disengaged from the connection header by means of the card engagement plate and is moved the initial distance $d_3$. The longitudinal spring will cause the eject finger to move longitudinally forwardly until cam surface of the finger 366 is moved into engagement with the rounded rear corner 348 of the card 284 by means of the cam surface 356 on the recess. At this point forward longitudinal force will be exerted on the card by the eject finger until such time as the planar front surface of the eject finger comes into contact with the planar front surface 374 of the longitudinal recess so as to move the memory card a further longitudinal distance $d_4$ forward. Preferably, the distance $d_3$ will be from 1 mm to 3 mm, and the distance $d_4$ will be from 3 mm to 5 mm. No force or substantially no force will be exerted on the memory card in a longitudinal direction until the card has already been disengaged from the connector.

It will be appreciated that there has been described an inexpensive and easily manufactured means for allowing efficient ejectment of a memory card to the point where it can be easily gripped for further manual removal. It will also be appreciated that this means exerts no force or substantially no force on the memory card in a longitudinal direction until it is activated to eject the memory card.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A connector assembly for engaging and disengaging a PC card comprising:
   (a) a frame member having a rear transverse element and a pair of spaced lateral elements extending longitudinally forward from the rear element;
   (b) an electrical connector disposed adjacent the rear element of the frame member;
   (c) an actuator for moving the memory card longitudinally forward and out of engagement with the connector; and
   (d) a stored energy actuator for moving the PC card still further forward after said PC card has first been moved out of engagement with the connector.

2. The connector assembly as recited in claim 1, wherein said stored energy actuator includes a helical spring.

3. The connector assembly as recited in claim 1, wherein said stored energy actuator includes a torsional spring.

4. The connector assembly as recited in claim 1, wherein said stored energy actuator is a part of one of said lateral elements.

5. An eject header for a PC card, comprising:
   a header adapted to mate with the PC card;
   a frame disposed adjacent said header to guide the PC card relative to said header;
   a first actuator adapted to unmate the PC card from said header and to move the PC card to a first position; and
   a second actuator adapted to move the PC card from the first position to a second position located further away from said header.

6. The eject header as recited in claim 5, wherein said second actuator is part of said frame.

7. The eject header as recited in claim 5, wherein said second actuator is spring-loaded.

8. The eject header as recited in claim 7, wherein said second actuator includes a helical spring.

9. The eject header as recited in claim 7, wherein said second actuator includes a torsional spring.

10. An electrical connector assembly for disengaging an electronic card, comprising:
    an electrical connector;
    a frame adjacent said connector for guiding the electronic card relative to said connector;
    a linkage for unmating the electronic card from said connector; and
    an ejector for moving the electronic card further away from said connector.

11. The electrical connector assembly as recited in claim 10, wherein said ejector actuator is part of said frame.

12. The electrical connector assembly as recited in claim 10, wherein said ejector is spring-loaded.

13. The electrical connector assembly as recited in claim 12, wherein said ejector includes a helical spring.

14. The electrical connector assembly as recited in claim 12, wherein said ejector includes a torsional spring.

* * * * *